United States Patent [19]
Tobin

[11] Patent Number: 5,838,692
[45] Date of Patent: Nov. 17, 1998

[54] SYSTEM AND METHOD FOR EXTRACTING REALTIME DEBUG SIGNALS FROM AN INTEGRATED CIRCUIT

[75] Inventor: Paul G. Tobin, Fort Collins, Colo.

[73] Assignee: Hewlett-Packard Company, Palo Alto, Calif.

[21] Appl. No.: 749,121

[22] Filed: Nov. 14, 1996

[51] Int. Cl.⁶ .................................................. G06F 11/00
[52] U.S. Cl. ..................................... 371/22.1; 395/183.06
[58] Field of Search .................................. 371/22.1, 22.5,
371/27.7; 395/285, 289, 183.01, 183.06,
183.1, 183.15, 183.21, 308, 575, 281, 287,
292, 293, 183.07, 183.19; 364/500, 765

[56] References Cited

U.S. PATENT DOCUMENTS

| | | | |
|---|---|---|---|
| 4,910,417 | 3/1990 | El Gamal et al. | 307/465 |
| 5,317,711 | 5/1994 | Bourekas et al. | 395/425 |
| 5,418,452 | 5/1995 | Pyle | 324/158.1 |
| 5,473,754 | 12/1995 | Folwell et al. | 395/183.21 |
| 5,488,688 | 1/1996 | Gonzales et al. | 395/183.1 |
| 5,525,971 | 6/1996 | Flynn | 340/825.06 |
| 5,544,311 | 8/1996 | Harenberg et al. | 395/183.16 |
| 5,548,794 | 8/1996 | Yishay et al. | 395/871 |
| 5,574,894 | 11/1996 | Hes et al. | 395/555 |
| 5,590,354 | 12/1996 | Klapproth et al. | 395/800 |
| 5,642,487 | 6/1997 | Flynn et al. | 395/250 |
| 5,652,870 | 7/1997 | Yamasaki et al. | 395/500 |
| 5,657,283 | 8/1997 | Hill | 365/201 |
| 5,675,749 | 10/1997 | Hartvigsen | 395/308 |

*Primary Examiner*—Robert W. Beausoliel, Jr.
*Assistant Examiner*—Nadeem Iqbac

[57] ABSTRACT

A system and method for extracting custom debug signals from an integrated circuit chip. The custom debug signals, which are normally extracted via bonded custom debug pads during the testing of the chip, are made available in production chips, where the custom debug pads are not bonded and therefore unavailable, via the external I/O bus of the integrated circuit. In a preferred embodiment, the integrated circuit operates normally to drive standard debug data from internal nodes of the integrated circuit onto the I/O bus during idles cycles in the normal operation of the integrated circuit. Selection means may be set to drive the custom debug signals onto the I/O bus during idle cycles of normal integrated circuit operation rather than the standard debug data.

13 Claims, 5 Drawing Sheets

SYSTEM AND METHOD FOR EXTRACTING REALTIME DEBUG SIGNALS FROM AN INTEGRATED CIRCUIT

FIELD OF THE INVENTION

The present invention relates generally to debugging integrated circuits, and more particularly, to a system and method for extracting debug signals from an integrated circuit during realtime operation.

BACKGROUND OF THE INVENTION

Integrated circuit technology has experienced a tremendous growth in the ability to provide ever increasing functional complexity in smaller and smaller integrated circuit packages. The rapid advances in integrated circuit technology provides many benefits. One such benefit is the rapid increase in computer system performance due in part to the decreased distance signals must travel within the system. Another benefit experienced by heavily integrated circuits is increased noise immunity due to fewer non-integrated system components.

In the field of integrated circuit testing and debugging, however, new problems have arisen. With the increased density of circuit integration has come an increasing number of system signals which remain internal to the integrated circuit chip and which therefore remain inaccessible via external pins of the chip. The inaccessibility of internal chip signals causes great difficulty in locating functional and electrical failures in the integrated circuit during the testing and debugging process. With only the external. pins available for monitoring, many functional and electrical problems of the integrated circuit are hidden because the root of the problem may be seen only at the internal signal level. One prior art solution for making internal signals available external to the chip includes routing internal signals which are critical to debugging the integrated circuit to external pins, collectively referred to as a debug bus. However, this solution first requires that the size of the chip package support enough pins to provide enough debug information on its debug bus to be useful. Most recent microprocessors supporting a 64-bit to 128-bit data bus and multiple, parallel instruction issue, require at least a 32-bit debug bus to be effective. In addition, at the high operating frequencies of today's microprocessors, sampling the debug data at the CPU frequency requires a complex external data capture board that probes package pins bonded to special circuit die sites (debug sites). A data capture board may suffice during the testing of prototype integrated circuits, but on production parts, the debug pads of the integrated circuits are not bonded at all. A need exists, therefore, for a system and method for extracting debug signals in realtime from production part integrated circuits for use in testing and debugging.

Accordingly, it is an object of the invention to provide a system and method for extracting debug signals from production parts of an integrated circuit during realtime operation without interrupting or slowing the normal operation of the integrated circuit. The debug signals may then be used to create event traces for use in testing and debugging production parts of the integrated circuit.

SUMMARY OF THE INVENTION

In accordance with a preferred embodiment of the invention, a system and method for diverting debug data from the custom debug pins to the universally present external I/O bus in the case that the debug pins are not bonded (i.e. on production parts) is presented. Specifically, in the preferred embodiment, instruction fetch address bits are routed to the external I/O bus on debug cycles, rather than attempting to sample them on the (now absent) special debug pins. By routing the lower instruction address bits of the instruction address bus to the always present I/O bus when the I/O bus is idle, the program execution of the CPU may be made visible for use in extracting a program trace. The method and system of the intervention involves obtaining debug data from internal debug nodes of the integrated circuit, determining when the external I/O bus of the integrated circuit is idle, driving the debug data onto the I/O bus, and indicating via an external debug control pin of the integrated circuit that the debug data is available on the I/O bus. In a preferred embodiment, signals from internal debug nodes of the integrated circuit which would normally be bonded to dedicated debug pads during prototype testing are latched into a debug data latch. The debug data is held in the latch and driven onto the I/O bus only after a debug control logic block arbitrates for use of the bus and receives permission to use the I/O bus from an I/O bus control logic block. Also in the preferred embodiment, the debug data is driven onto the I/O bus concurrently with a dedicated debug clock signal. The debug clock signal is the inverted CPU clock signal in the preferred embodiment.

The integrated circuit may include a programmable debug enable signal which is used to turn the collection and transmission of debug data on or off. This allows the integrated circuit to provide realtime debug signal visibility only if a user desires it.

The integrated circuit may also include a programmable debug select signal to cause the debug data to be collected from different sets of nodes of the integrated circuit. In this case, each of the different sets of nodes are multiplexed and selected to be driven on the I/O bus by a debug select control signal. The debug select control signal may be programmed by a debug select command received on the I/O bus. The selectable debug bus provides the user with flexibility in setting up the desired trace signals.

The present invention may be used to obtain a realtime trace of internal signal events. The present invention provides an effective tool for use in debugging the integrated circuit during normal operation and in pinpointing integrated circuit failures.

BRIEF DESCRIPTION OF THE DRAWINGS

The objects and advantages of the invention will become more apparent and more readily appreciated from the following detailed description of the presently preferred exemplary embodiment of the invention taken in conjunction with the accompanying drawings, of which.

DETAILED DESCRIPTION OF THE PRESENT INVENTION

The preferred embodiment of the present invention is discussed below with reference to the drawings, where like reference numbers represent like elements.

Figure 1:
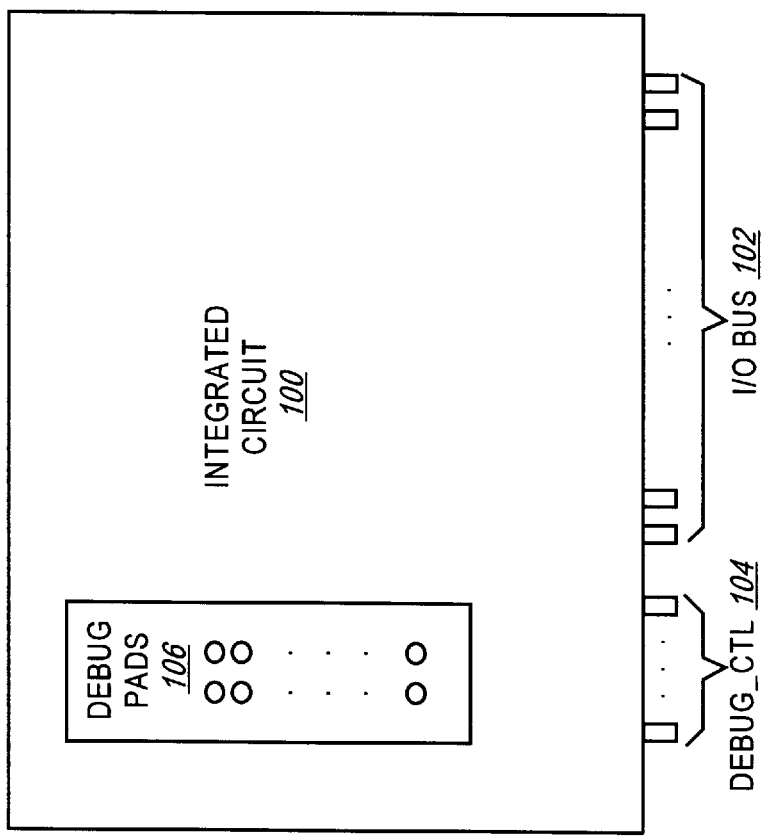
FIG. 1 is a top-view illustration of an integrated circuit package according to the present invention.

FIG. 1 is a top-view illustration of an integrated circuit package 100 in accordance with a preferred embodiment of the present invention. As shown in FIG. 1, the integrated circuit package 100 includes a plurality of external pins. One set of collective pins comprises an input/output (I/O) bus 102. The integrated circuit package 100 also includes one or more external dedicated debug pins DEBUG_CTL 104 which may be used to monitor internal debug data. The integrated circuit package 100 may also include a plurality of dedicated debug pads 106 which during prototype testing and debugging may be presented to a special data capture board (not shown) for retrieving debug information. For normal production parts, however, the debug pads 106 are not bonded and are therefore not available for retrieving debug information.

Figure 2:
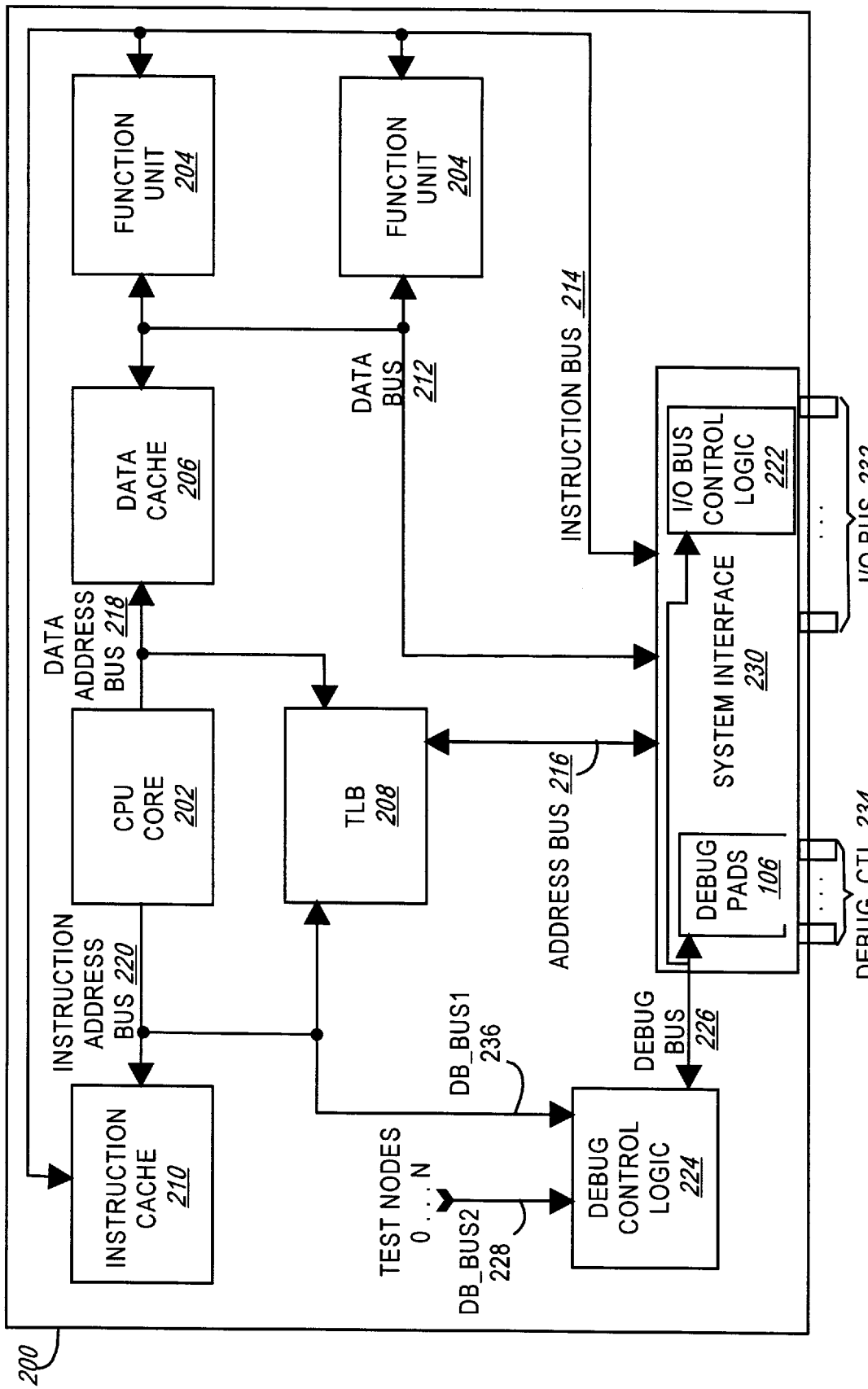
FIG. 2 is a high-level block diagram of an integrated circuit which implements the present invention.

FIG. 2 is a high-level block diagram of an integrated circuit chip 200 in which the present invention is implemented. The preferred embodiment of the present invention is discussed in the context of an integrated circuit 200 which implements a microprocessor architecture. Although representative of the type of integrated circuit in which the present invention may be utilized to test and debug the integrated circuit, the microprocessor architecture of integrated circuit 200 is not intended in any way to limit the form of the present invention. Accordingly, the integrated circuit in which the present invention may be implemented may include any other integrated circuit of interest. The integrated circuit 200 shown in FIG. 2 is a model of the computer architecture of the PA-7300LC RISC chip, manufactured by Hewlett-Packard Company, Palo Alto, Calif.

As shown in FIG. 2, integrated circuit 200 includes a central processing unit (CPU) 202. The CPU 202 receives instructions and executes them. Depending on the instruction, the CPU may delegate certain work to be completed to special function units 204. Special function units are dedicated hardware units optimally designed to perform a given function. The use of special function units 204 substantially increases the performance of a processor.

The integrated circuit 200 shown in FIG. 2 also includes an instruction cache 210 and data cache 206. Instruction fetches and data accesses each require access to data from a main memory external to the integrated circuit 200. In the integrated circuit 200 shown in FIG. 2, all instructions executed by the CPU 202 are first moved from a main memory (not shown) into the instruction cache 210 and all data accessed by the CPU 202 is first moved from main memory into the data cache 206. Move-in rules are known in the art. Typically, whenever a request for access to a given data item is issued and the cache does not contain the requested data item, the entire cache line (i.e., block of data) in main memory where the requested data item resides is moved into the cache at the same time. Most modern computer systems also support virtual addressing. To support virtual addressing, a translation lookaside buffer (TLB) is typically used to provide virtual to absolute address translations. As shown in FIG. 2, the integrated circuit includes a TLB 208 which is a shared data/instruction fetch resource. In operation, the CPU 202 requests a memory address to be accessed on either an internal instruction address bus 220 or an internal data address bus 218. The TLB holds the virtual to real address mappings. When presented with a virtual address, it attempts to find the corresponding physical address (real address). On failing to do so, special hardware or software is invoked to place such a translation into the TLB (the computer operating system controls address mappings). This is a "TLB Hit" or "TLB Miss". Once a physical address is determined, the cache is checked to see if that line of data (from physical memory) is present in the cache. If so, it is a "cache hit" and the data or instruction is immediately available. If not, it is a "cache miss" and the data or instruction must be retrieved from memory. Instructions and data are received from an external input/output (I/O) bus 232 by a system interface 230. Instructions are sent to the instruction cache 210 on an internal instruction bus 214 and data is sent to the data cache 206 on an internal data bus 212. The TLB 208 is updated with TLB address information on an internal TLB address bus 216 whenever a new physical virtual address mapping must be introduced. From the above discussion, it is clear that the signals on the internal instruction address bus 220, data address bus 218, instruction bus 214, data bus 212, and TLB address bus 216 are inaccessible external to the integrated circuit 200 via the system interface 230.

The integrated circuit 200 of the present invention also includes a debug control logic block 224 which implements critical features of the invention. The debug control logic block 224 may receive various signals including both internal bus signals and external pin signals of interest depending on the integrated circuit design. Accordingly, it may be deemed interesting in the integrated circuit 200 to make available some or all of the signals present of one or more of the internal busses of the integrated circuit 200. As will be obvious to one skilled in the art, the debug control logic block 224 may be configured to receive signals present on any internal node of the integrated circuit. In the preferred embodiment shown in FIG. 2, for example, the debug control logic block 224 receives a set of standard debug signals from a set of test nodes TESTNODE 0 . . . N on a debug bus DB_BUS2. The debug control logic block 224 also receives the 12 low order bit signals present on the instruction address bus 220 on a debug bus DB_BUS1. The signals on bus DB_BUS1 are coupled to debug pads 106 to allow the program execution to be traced on I/O bus 232 during debugging. The debug control logic block 224 multiplexes the debug busses DB_BUS1 and DB_BUS2 and sends the debug and debug control signals to and from the system interface 230 on an internal debug bus 226. As shown in FIG. 2, the debug bus 226 is coupled to the debug pads 106, which may or may not be bonded to an I/O bus control logic block 222. The details and operation of the debug control logic block 224 are discussed hereinafter.

Figure 3:
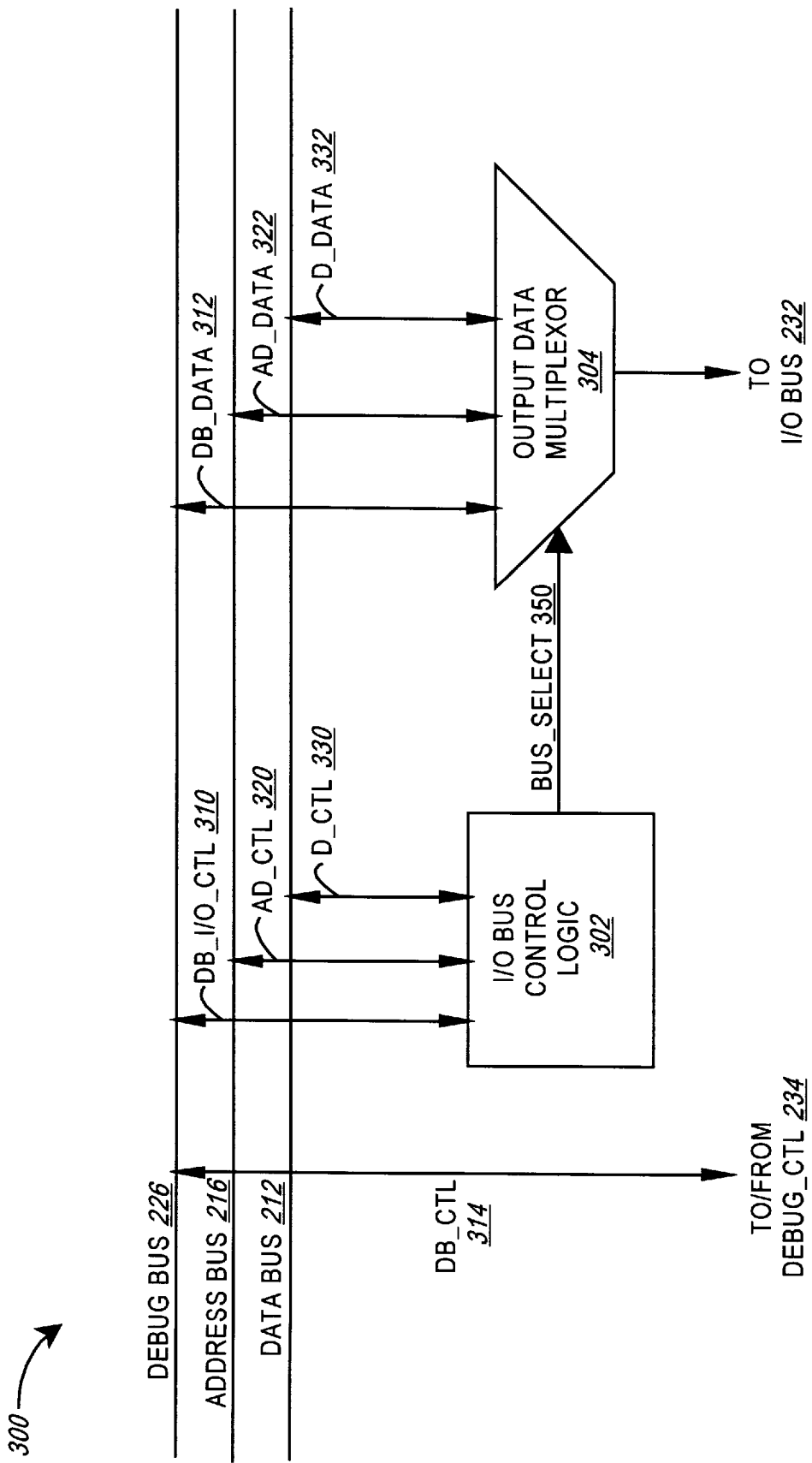
FIG. 3 is a schematic block diagram of the output portion of the system interface of FIG. 2 in accordance with the preferred embodiment of the invention.

FIG. 3 is a schematic block diagram of the output portion of the system interface 230 of FIG. 2 in accordance with the preferred embodiment of the invention. As shown in FIG. 3, the output system interface, shown generally at 300 includes an I/O bus control logic block 302 and an output data multiplexor 304. The I/O bus control logic block 302 implements the bus protocol for output to the I/O bus. In general, the I/O bus control logic block 302 is coupled to the debug bus 226, address bus 216 and data bus 212 via debug control lines DB_I/O_CTL 310, address control lines AD_CTL 320 and data control lines D_CTL respectively. The output data multiplexor 304 is connected to receive as data input the data lines of the debug bus 226, address bus 216 and data bus 212. More specifically, the output data multiplexor 304 receives as input debug data lines DB_DATA 312, address data lines AD_DATA 322 and data lines D_DATA 332 respectively. The output of the output data multiplexor 304 is coupled to the I/O bus 232. The output data multiplexor 304 sends one set of its inputs 312, 322 or 332 to be output on the I/O bus 232. The input 312, 322, 332 selected to be output on the I/O bus 232 is determined by the I/O bus control logic 302, which sends a selector signal BUS_SELECT to a select input of the output data multiplexor 304 on select lines 350. FIG. 3 also shows that signals are sent to the external DEBUG_CTL pins 234 on debug control lines DB_CTL 314.

Figure 4:
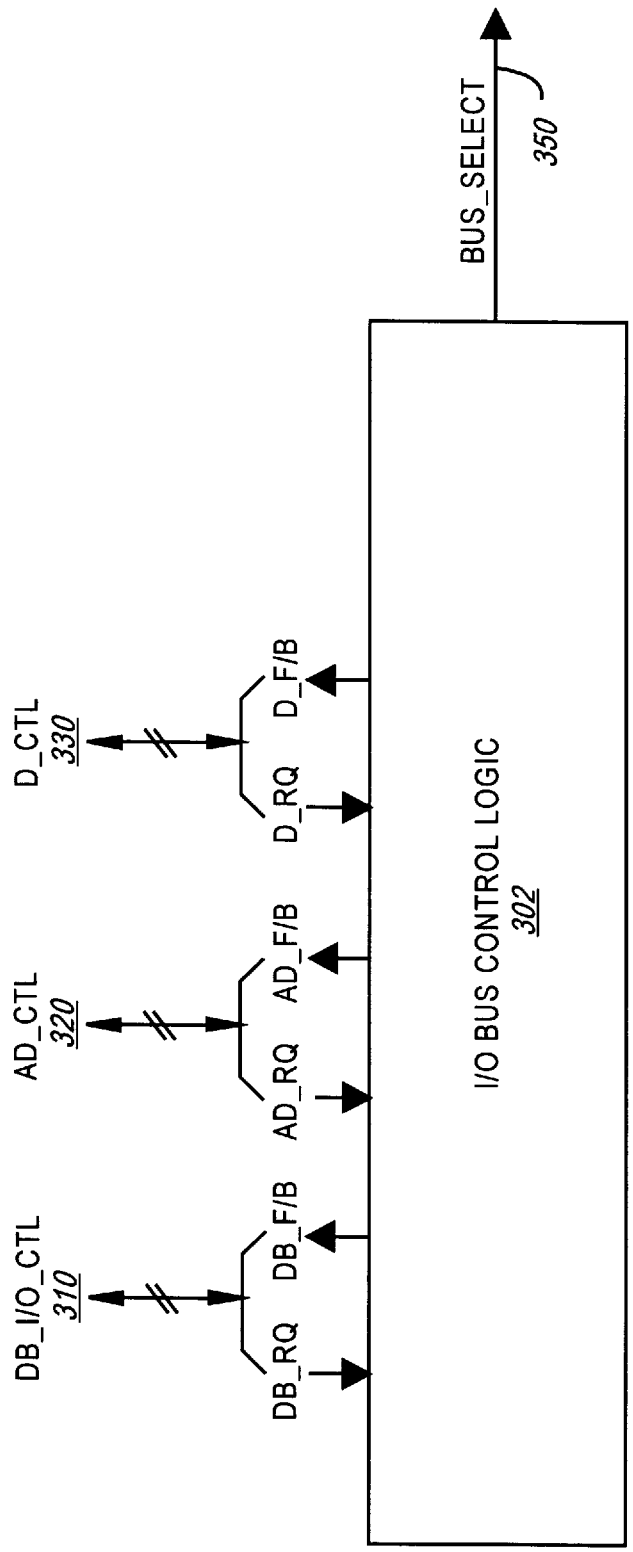
FIG. 4 is a more detailed block diagram of the I/O bus control logic block of FIG. 3.

FIG. 4 is a more detailed block diagram of the I/O bus control logic block 302 of FIG. 3. As shown in FIG. 4, the I/O bus control logic block 302 is coupled to receive bus request signals DB_RQ, AD_RQ, D_RQ on respective control lines DB_I/O_CTL 310, AD_CTL 320, D_CTL 330 from the respective debug bus 226, address bus 216 and data bus 212. The I/O bus control logic block 302 is coupled to send respective bus free/busy signals DB_F/B, AD_F/B, D_F/B on respective control lines DB_I/O_CTL 310, AD_CTL 320, D_CTL 330 to the respective debug bus 226, address bus 216 and data bus 212. The I/O bus control logic utilizes the bus request signals DB_RQ, AD_RQ, D_RQ and bus free/busy signals DB_F/B, AD_F/B, D_F/B to arbitrate bus requests and to select one of the debug bus 226, address bus 216 or data bus 212 for output onto the I/O bus 232. The selected bus is encoded into a bus select signal BUS_SELECT which is output onto lines 350 for use as the select input of the output data multiplexor 304. Bus arbitration protocols are known in the art. Thus, any suitable bus arbitration protocol may be used when implementing the I/O bus control logic block 302 and any alternative implementation of bus control signals may be implemented for use in the present invention.

Figure 5:
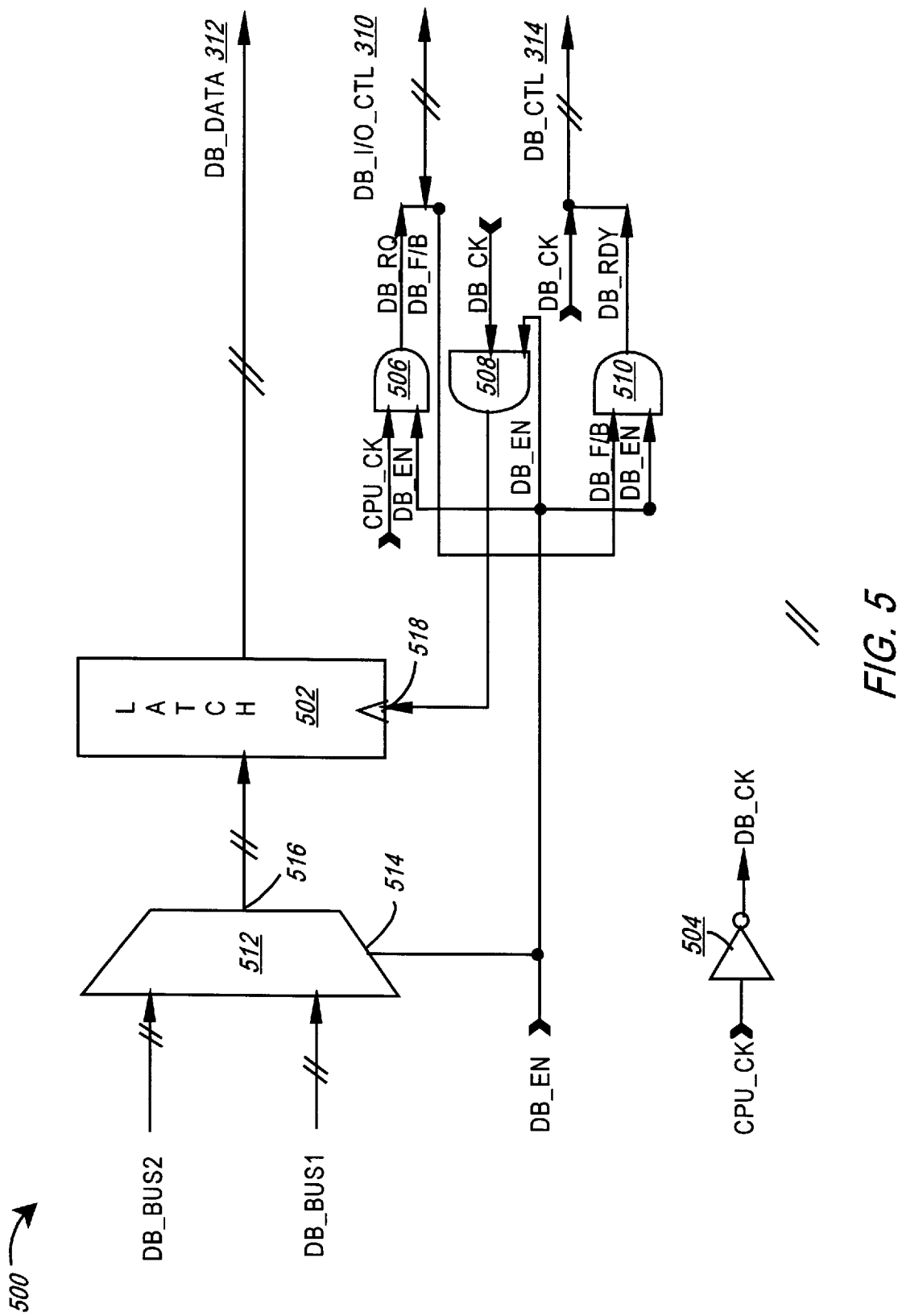
FIG. 5 is a schematic block diagram of a preferred embodiment implementation of the debug control logic block of FIG. 2 in accordance with the present invention.

FIG. 5 is a schematic block diagram of a preferred embodiment implementation of the debug control logic block 224 of FIG. 2 in accordance with the present invention. As shown in FIG. 5, the control logic block, shown generally at 500, receives debug data. In the referred embodiment shown in FIG. 2, the debug data comprises signals present on the instruction address bus 220. The control logic block 500 also is coupled to send and receive debug control signals on lines DB_CTL 314 to and from the external debug pins DEBUG_CTL 234 via the system interface 230. In the preferred embodiment, the debug control signals comprise a debug clock output signal DB_CK and a debug ready output signal DB_RDY. In the preferred embodiment, a debug enable signal DB_EN is derived from a programmable control register which is set by sending a debug enable instruction to the integrated circuit 200 on the I/O bus 232. The debug enable signal DB_EN is used by the debug control logic block 500 to determine whether or not to output the debug data from debug bus DB_BUS1 onto the debug data lines DB_DATA 312 and in generating other debug control signals such as the debug ready output signal DB_RDY and the debug bus request signal DB_RQ, discussed hereinafter. In the alternative, the debug enable signal DB_EN may be directly coupled to one of the external debug control pins DEBUG_CTL 234 and therefore held high whenever it is desired to place the integrated circuit 200 into debug mode.

The debug clock output signal DB_CK and debug ready output signal DB_RDY are each sent to a different one of the external debug control pins DEBUG_CTL 234. The debug clock output signal DB_CK is an inverted version of the CPU clock signal CPU_CK, as shown in FIG. 5 by invertor 504. The debug ready output signal DB_RDY is designed to be true each debug clock cycle that valid debug data is driven on the debug data lines DB_DATA 312. The details of how the debug ready signal DB_RDY is generated in the preferred embodiment is discussed hereinafter. The debug clock signal DB_CK and debug ready signal DB_RDY are monitored by an external signal sampler, such as a logic analyzer. The external signal sampler is configured to sample the debug data on the I/O bus 232 on each rising edge of DB_CK that DB_RDY is true, and to ignore DB_CK cycles in which DB_RDY is false.

As shown in FIG. 5, the debug control logic block includes a multiplexor 512 which is coupled to receive the debug data. The multiplexor 512 receives signals from the debug bus DB_BUS1, which is coupled to the debug pads 106. The multiplexor 512 also receives signals from the debug bus DB_BUS2 which is coupled to the test nodes TEST_NODE 0 . . . N. The multiplexor 512 has a select input 514 receives the enable signal DB_EN and which determines which multiplexor input is placed on the multiplexor output 516. A latch 502 is coupled to receive the multiplexor output 516.

As shown in FIG. 5, the control logic block 500 also is coupled to send and receive debug I/O bus control signals on lines DB_I/O_CTL 310 to and from the I/O bus control logic block 302 in the system interface 230. The debug I/O bus control signals include a debug I/O bus request signal DB_RQ and a debug bus free/busy signal DB_F/B. The debug I/O bus request signal DB_RQ is generated by AND gate 506 on a main system CPU clock edge CPU_CK if the debug enable signal DB_EN is true. If the bus is not in use (i.e., is "free"), the debug I/O bus free/busy signal DB_F/B will be true and each of the I/O bus free/busy signals AD_F/B, D_F/B, I_F/B of the address bus 216, data bus 212 and instruction bus 214 respectively will be false to indicate that the I/O bus is in use. The debug I/O bus free/busy signal DB_F/B is logically ANDed by AND gate 508 with the debug enable signal DB_EN and the debug clock signal DB_CK. The output of AND gate 508 is coupled to a set latch input 518 of the latch 502. When the output of AND gate 508 is true, the debug data is latched and driven onto the debug data lines DB_DATA 312. In other words, the debug data is output on the debug data lines DB_DATA 312 on the rising edge of the debug clock DB_CK if the debug enable signal is true and the debug control logic block has control of the I/O bus 232. At the same time, the debug ready signal DB_RDY also goes true if the debug enable signal is true and the debug control logic block has control of the I/O bus 232. Whenever the I/O bus 232 is in use by either the address bus 216, data bus 212 or instruction bus 214, the debug control logic block cannot get control of the I/O bus 232. In the preferred embodiment, the I/O bus control logic block 302 of the system interface 230 is configured to place the debug I/O bus requests DB_RQ at the lowest priority so that the debug mode of the integrated circuit does not interfere with normal operation of the chip.

It will be appreciated from the above description of the preferred embodiment that the present invention provides an effective method and system for diverting debug signals coupled to non-bonded debug pads of an integrated circuit to the always present I/O bus of the chip. The invention allows critical program execution information to be extracted during realtime operation of a production part chip without interference of its normal operation. The ability to extract debug information during realtime operation of the integrated circuit provides visibility into the program execution by the integrated circuit, which can be especially valuable when debugging integrated circuit failures.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method for extracting custom debug signals coupled to custom debug pads of an integrated circuit via an external I/O bus of said integrated circuit, said integrated circuit operable to drive standard debug data from internal nodes of said integrated circuit onto said I/O bus when said I/O bus is in an idle state during normal operation of said integrated circuit said method comprising the steps of:

(a) obtaining said standard debug data from internal nodes of said integrated circuit and said custom debug data from said custom debug pads in realtime during said normal operation of said integrated circuit;
   (b) determining when said I/O bus is idle during said normal operation of said integrated circuit;
   (c) selecting said custom debug data for output onto said I/O bus;
   (d) driving said selected custom debug data onto said I/O bus when said I/O bus is idle during normal operation of said integrated circuit; and
   (e) indicating via at least one external debug control pin of said integrated circuit that said custom debug data is present on said I/O bus.

2. The method of claim 1, wherein said determining step comprises:

(i) arbitrating for use of said I/O bus from an I/O bus control logic block; and
   (ii) receiving permission to use said I/O bus from said I/O bus control logic block.

3. The method of claim 1, wherein said selecting step comprises:

(i) storing said custom debug data present on said custom debug pads into a latch.

4. The method of claim 3, wherein said driving step comprises:

(i) driving said stored custom debug data onto said I/O bus.

5. The method of claim 1, said determining step comprising:

(f) monitoring said at least one external debug control pin to determine when said custom debug data is present on said I/O bus; and
   (g) reading said custom debug data from said I/O bus.

6. An integrated circuit, comprising:
   an external I/O bus;
   a set of custom debug pads;
   a set of standard debug nodes;
   a debug control logic block coupled to said set of standard debug nodes and to said set of custom debug pads, said debug control logic block comprising:
   selection means for selecting one of standard debug data and custom debug data, said standard debug data being present on said set of standard debug nodes and said custom debug data being present on said custom debug pads,
   I/O bus control means for determining when said I/O bus is idle during normal operation of said integrated circuit, and
   output control means for driving said debug data onto said I/O bus when said I/O bus is idle and for generating a debug signal; and
   at least one external debug control pin on which said debug signal is produced when said output control means drives said debug data onto said I/O bus, said debug signal indicating that said debug data is present on said I/O bus.

7. The integrated circuit of claim 6, wherein:
   said I/O bus control means determines that said I/O bus is idle by sending a debug I/O bus request to said I/O bus control block during normal operation of said integrated circuit and receiving a debug I/O bus status signal from said I/O bus control block indicating that said I/O bus is not in use.

8. The integrated circuit of claim 7, wherein:
   said selection means is responsive to a debug select command to select one or the other of said standard debug data and said custom debug data, said debug select command received on said I/O bus during said normal operation of said integrated circuit.

9. The integrated circuit of claim 7, comprising:
   at least one debug select control pin for receiving a debug select control signal, said selection means being responsive to said debug select control signal to select one or the other of said standard debug data and said custom debug data.

10. The integrated circuit of claim 6, wherein:
    said debug control logic block drives said selected debug data onto said I/O bus in synchronization with a debug clock signal, said debug clock signal having a frequency identical to a main system clock.

11. The integrated circuit of claim 10, wherein:
    said debug clock signal has a phase inverse to said main system clock.

12. A method for extracting debug data in realtime from an integrated circuit, said integrated circuit comprising an external I/O bus, a set of custom debug pads, a set of standard debug nodes internal to said integrated circuit, said debug data comprising custom debug data present on said custom debug pads and standard debug data present on said standard debug nodes, comprising:
    capturing said debug data in realtime during normal operation of said integrated circuit;
    determining when said external I/O bus is idle during said normal operation of said integrated circuit;
    selecting one or the other of said standard debug data and said custom debug data to be driven onto said I/O bus without interrupting said normal operation when said I/O bus is determined to be idle; and
    driving said selected debug data onto said I/O bus when the I/O bus is determined to be idle without interrupting said normal operation of said integrated circuit.

13. The method of claim 12, comprising:
    receiving said selected debug data from said I/O bus;
    extracting a program trace from said received selected debug data.

* * * * *